United States Patent
Kishimoto et al.

(10) Patent No.: US 11,251,278 B2
(45) Date of Patent: Feb. 15, 2022

(54) TRENCH-GATE MOS TRANSISTOR AND METHOD FOR MANUFACTURING

(71) Applicants: Kabushiki Kaisha Toshiba, Tokyo (JP); Toshiba Electronic Devices & Storage Corporation, Tokyo (JP)

(72) Inventors: Hiroyuki Kishimoto, Nonoichi Ishikawa (JP); Hiroaki Katou, Nonoichi Ishikawa (JP); Toshifumi Nishiguchi, Hakusan Ishikawa (JP); Saya Shimomura, Komatsu Ishikawa (JP); Kouta Tomita, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/014,266

(22) Filed: Sep. 8, 2020

(65) Prior Publication Data
US 2021/0202704 A1    Jul. 1, 2021

(30) Foreign Application Priority Data
Dec. 27, 2019    (JP) .................. 2019-238876

(51) Int. Cl.
*H01L 29/423*    (2006.01)
*H01L 29/40*    (2006.01)
(Continued)

(52) U.S. Cl.
CPC ........ *H01L 29/4236* (2013.01); *H01L 29/401* (2013.01); *H01L 29/407* (2013.01);
(Continued)

(58) Field of Classification Search
CPC ......... H01L 29/42336; H01L 29/42352; H01L 29/4236; H01L 29/66613–66628;
(Continued)

(56) References Cited

U.S. PATENT DOCUMENTS

| | | | | |
|---|---|---|---|---|
| 5,973,360 A | * | 10/1999 | Tihanyi | H01L 29/0653 257/330 |
| 8,884,362 B2 | * | 11/2014 | Matsuoka | H01L 29/41741 257/330 |

(Continued)

FOREIGN PATENT DOCUMENTS

| | | |
|---|---|---|
| JP | 2007-035841 A | 2/2007 |
| JP | 3930486 B2 | 6/2007 |
| JP | 5935948 B2 | 6/2016 |

*Primary Examiner* — Maliheh Malek
(74) *Attorney, Agent, or Firm* — Allen & Overy, LLP

(57) ABSTRACT

A semiconductor device includes a semiconductor part; first and second electrodes respectively on back and front surfaces of the semiconductor part; and a control electrode between the semiconductor part and the second electrode. The control electrode is provided inside a trench of the semiconductor part. The control electrode is electrically insulated from the semiconductor part by a first insulating film and electrically insulated from the second electrode by a second insulating film. The control electrode includes an insulator at a position apart from the first insulating film and the second insulating film. The semiconductor part includes a first layer of a first conductivity type provided between the first and second electrodes, the second layer of a second conductivity type provided between the first layer and the second electrode and the third layer of the first conductivity type selectively provided between the second layer and the second electrode.

12 Claims, 13 Drawing Sheets

(51) Int. Cl.
*H01L 29/417* (2006.01)
*H01L 21/28* (2006.01)

(52) U.S. Cl.
CPC .. *H01L 29/41775* (2013.01); *H01L 29/42336* (2013.01); *H01L 29/42352* (2013.01); *H01L 29/42364* (2013.01); *H01L 21/28008* (2013.01); *H01L 21/28017* (2013.01); *H01L 21/28026* (2013.01); *H01L 21/28035* (2013.01)

(58) Field of Classification Search
CPC ............ H01L 29/7813; H01L 29/7825; H01L 21/28008; H01L 21/28017; H01L 21/28026; H01L 28/28035
See application file for complete search history.

(56) References Cited

U.S. PATENT DOCUMENTS

| | | | | |
|---|---|---|---|---|
| 9,035,377 | B2* | 5/2015 | Sato | H01L 29/0634 |
| | | | | 257/329 |
| 9,793,395 | B1* | 10/2017 | Liu | H01L 21/30604 |
| 9,842,924 | B2* | 12/2017 | Katou | H01L 29/7813 |
| 10,319,850 | B2* | 6/2019 | Shimomura | H01L 29/7813 |
| 10,840,368 | B2* | 11/2020 | Ohno | H01L 29/41741 |
| 2002/0034855 | A1* | 3/2002 | Horiguchi | H01L 27/108 |
| | | | | 438/298 |
| 2005/0191810 | A1 | 9/2005 | Matsuda et al. | |
| 2007/0023828 | A1 | 2/2007 | Kawamura et al. | |
| 2007/0059889 | A1* | 3/2007 | Yoo | H01L 29/66621 |
| | | | | 438/282 |
| 2007/0145416 | A1* | 6/2007 | Ohta | H01L 29/4236 |
| | | | | 257/213 |
| 2010/0059815 | A1* | 3/2010 | Grivna | H01L 29/66727 |
| | | | | 257/330 |
| 2011/0136310 | A1* | 6/2011 | Grivna | H01L 29/407 |
| | | | | 438/270 |
| 2011/0169103 | A1* | 7/2011 | Darwish | H01L 29/7835 |
| | | | | 257/409 |
| 2012/0156844 | A1* | 6/2012 | Kim | H01L 27/10891 |
| | | | | 438/270 |
| 2013/0062688 | A1* | 3/2013 | Kobayashi | H01L 29/0878 |
| | | | | 257/330 |
| 2013/0069150 | A1* | 3/2013 | Matsuoka | H01L 29/42376 |
| | | | | 257/330 |
| 2013/0153994 | A1* | 6/2013 | Lin | H01L 29/7813 |
| | | | | 257/330 |
| 2013/0221498 | A1* | 8/2013 | Hayashi | H01L 29/66734 |
| | | | | 257/655 |
| 2014/0284773 | A1* | 9/2014 | Nishiguchi | H01L 29/7813 |
| | | | | 257/637 |
| 2014/0377934 | A1* | 12/2014 | Takesako | H01L 27/10894 |
| | | | | 438/396 |
| 2015/0008513 | A1* | 1/2015 | Lin | H01L 29/66734 |
| | | | | 257/330 |
| 2015/0021685 | A1* | 1/2015 | Matsuoka | H01L 29/4236 |
| | | | | 257/330 |
| 2015/0076589 | A1* | 3/2015 | Sato | H01L 29/7802 |
| | | | | 257/329 |
| 2015/0207407 | A1* | 7/2015 | Nishiwaki | H01L 27/0203 |
| | | | | 323/271 |
| 2015/0380538 | A1 | 12/2015 | Ogawa | |
| 2016/0093719 | A1* | 3/2016 | Kobayashi | H01L 29/66734 |
| | | | | 257/330 |
| 2016/0218190 | A1* | 7/2016 | Fukuoka | H01L 29/4236 |
| 2017/0213906 | A1* | 7/2017 | Li | H01L 29/4236 |
| 2017/0222038 | A1* | 8/2017 | Katou | H01L 29/42376 |
| 2018/0114857 | A1* | 4/2018 | Okada | H01L 27/0255 |
| 2018/0374950 | A1* | 12/2018 | Kobayashi | H01L 29/407 |
| 2019/0288103 | A1* | 9/2019 | Nishiwaki | H01L 29/086 |
| 2019/0305092 | A1* | 10/2019 | Blank | H01L 29/0696 |
| 2020/0052077 | A1* | 2/2020 | Altstaetter | H01L 29/0696 |
| 2020/0083335 | A1* | 3/2020 | Leomant | H01L 21/02164 |
| 2020/0259015 | A1* | 8/2020 | Nishiguchi | H01L 29/7811 |
| 2020/0266293 | A1* | 8/2020 | Katou | H01L 29/0696 |
| 2020/0273978 | A1* | 8/2020 | Ohno | H01L 29/0696 |
| 2020/0295150 | A1* | 9/2020 | Nishiwaki | H01L 29/66734 |
| 2020/0295181 | A1* | 9/2020 | Shimomura | H01L 29/7813 |
| 2020/0303510 | A1* | 9/2020 | Kikuchi | H01L 29/4236 |
| 2021/0005715 | A1* | 1/2021 | Feil | H01L 29/7802 |
| 2021/0057573 | A1* | 2/2021 | Shimomura | H01L 29/66734 |
| 2021/0057574 | A1* | 2/2021 | Nishiwaki | H01L 23/535 |
| 2021/0074540 | A1* | 3/2021 | Shiraishi | H01L 21/02233 |
| 2021/0074848 | A1* | 3/2021 | Katou | H01L 29/0696 |
| 2021/0083103 | A1* | 3/2021 | Katou | H01L 29/66734 |
| 2021/0202736 | A1* | 7/2021 | Nishiguchi | H01L 29/66734 |
| 2021/0225837 | A1* | 7/2021 | Katou | H01L 29/8611 |
| 2021/0288176 | A1* | 9/2021 | Tomita | H01L 29/66734 |

* cited by examiner

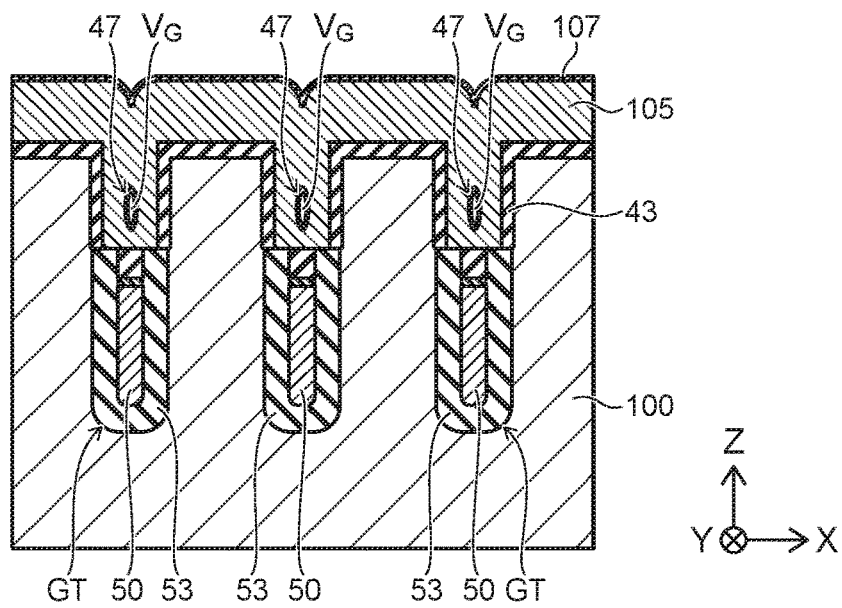
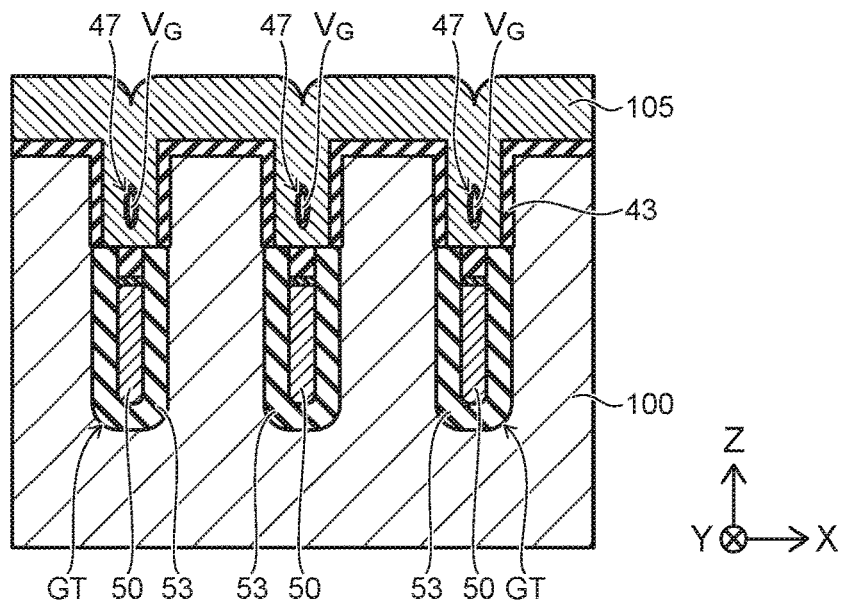
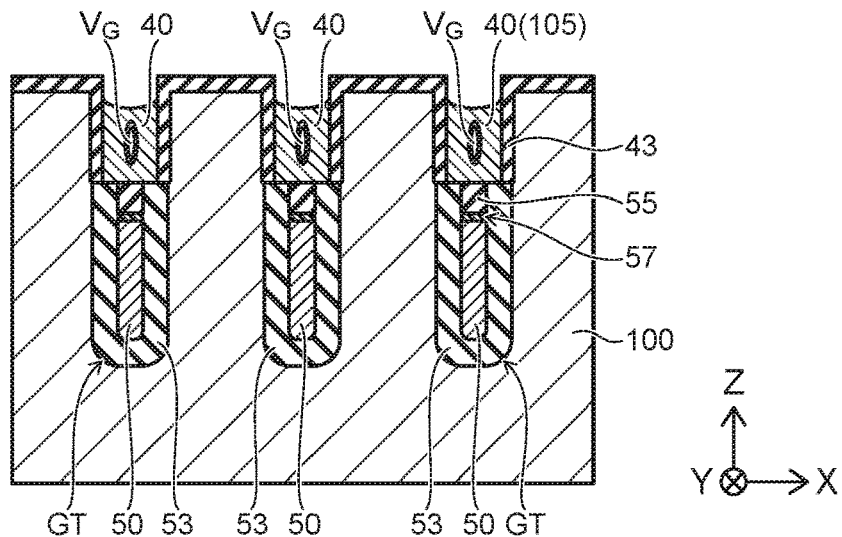

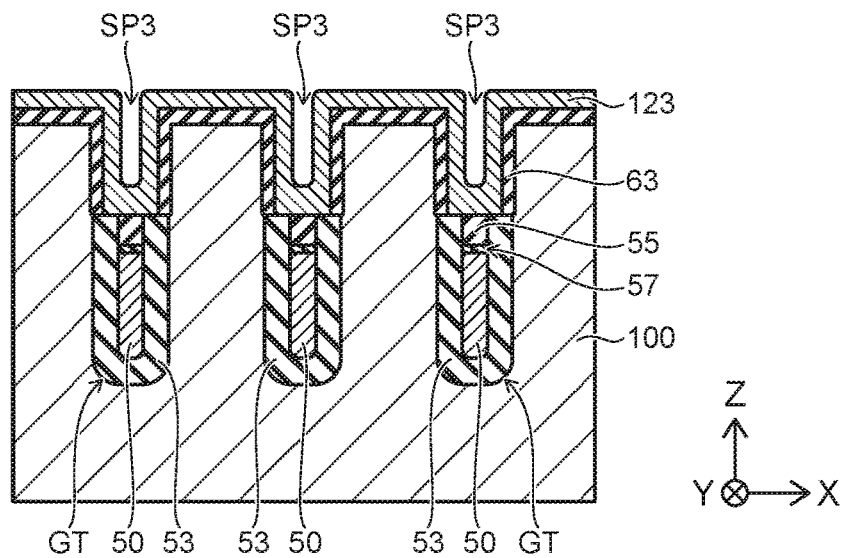
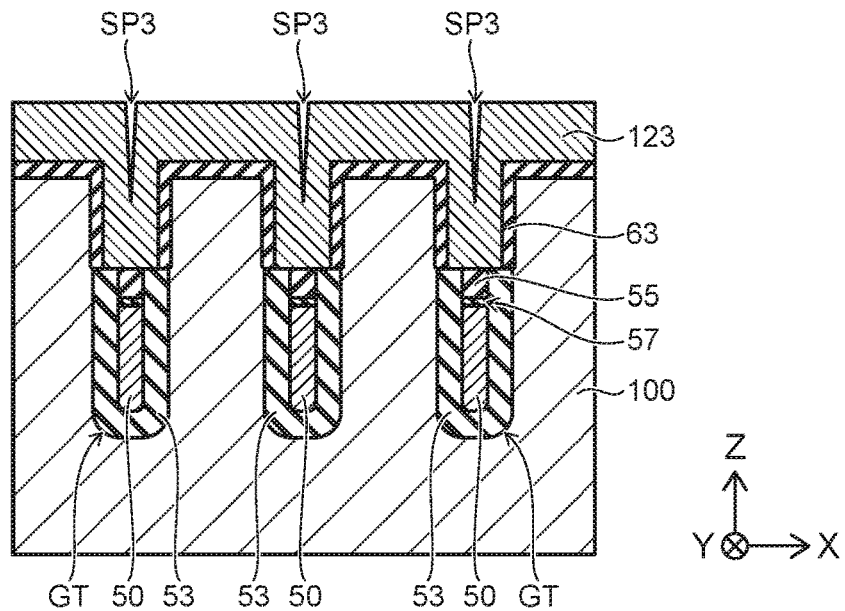
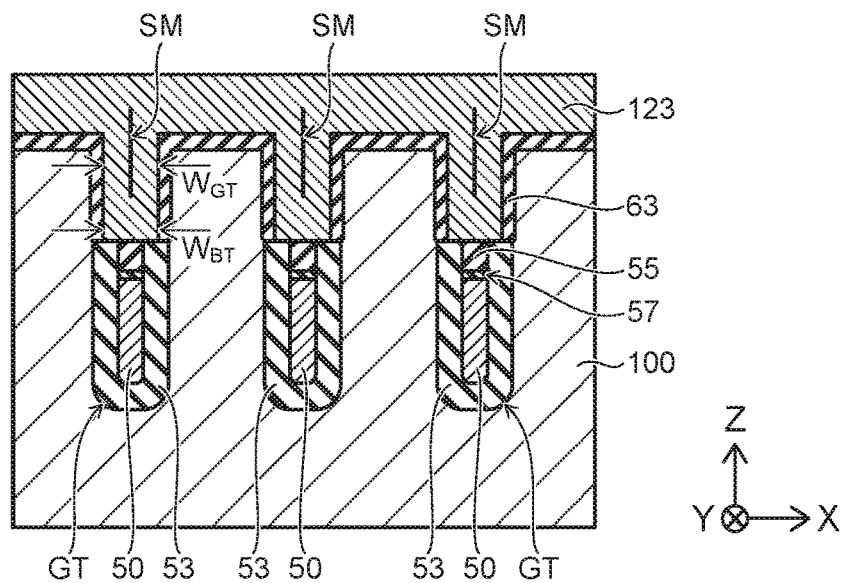

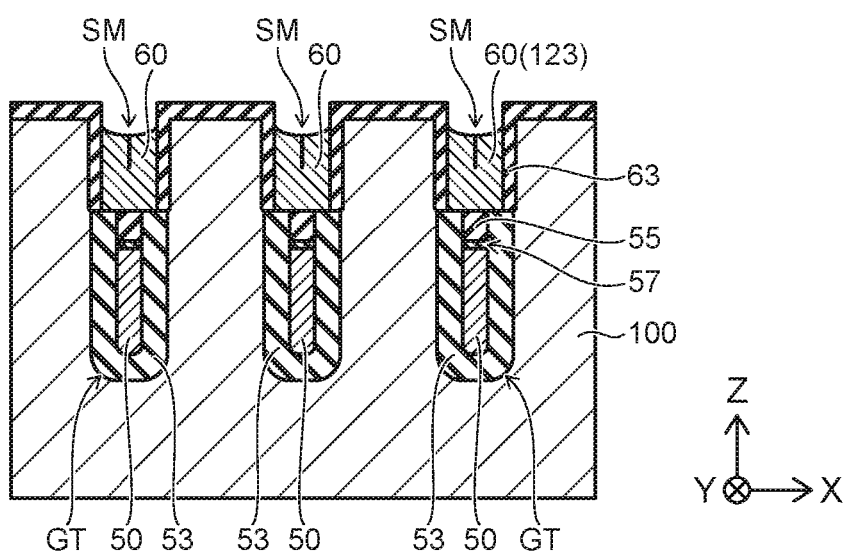
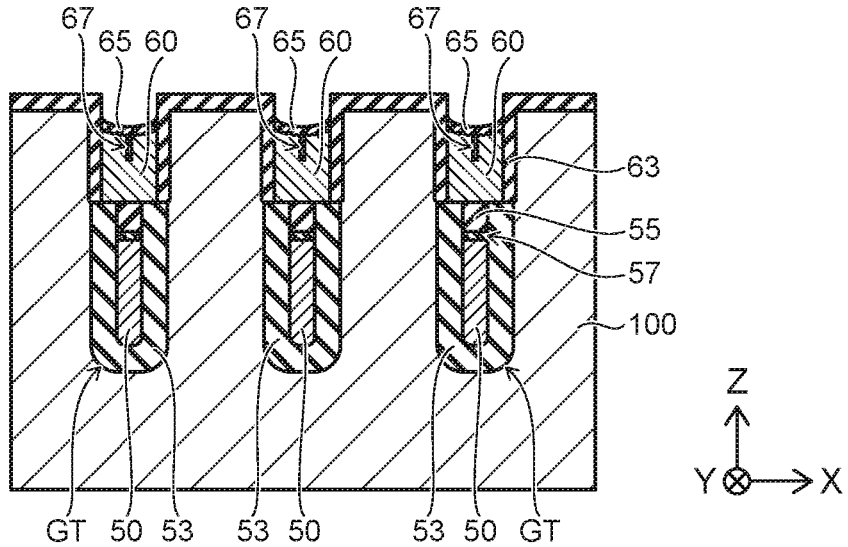
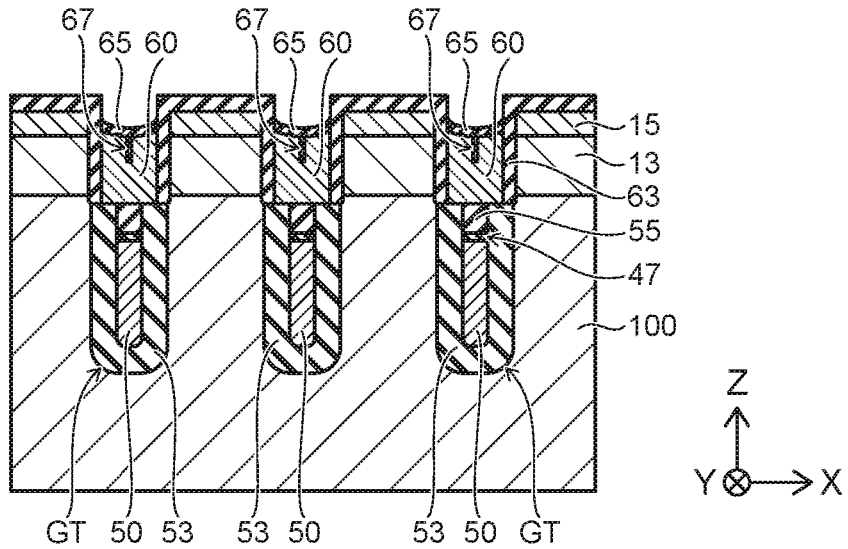

TRENCH-GATE MOS TRANSISTOR AND METHOD FOR MANUFACTURING

CROSS-REFERENCE TO RELATED APPLICATIONS

This application is based upon and claims the benefit of priority from Japanese Patent Application No. 2019-238876, filed on Dec. 27, 2019; the entire contents of which are incorporated herein by reference.

FIELD

Embodiments relate to a semiconductor device and a method for manufacturing the same.

BACKGROUND

There are cases where the transistor characteristics of a trench-gate MOS transistor degrade due to a void included in a gate electrode provided inside a gate trench.

BRIEF DESCRIPTION OF THE DRAWINGS

FIGS. 2A to 7B are schematic cross-sectional views showing manufacturing processes of the semiconductor device according to the first embodiment;

FIGS. 11A to 12C are schematic cross-sectional views showing manufacturing processes of the semiconductor device according to the second embodiment.

DETAILED DESCRIPTION

Figure 1:
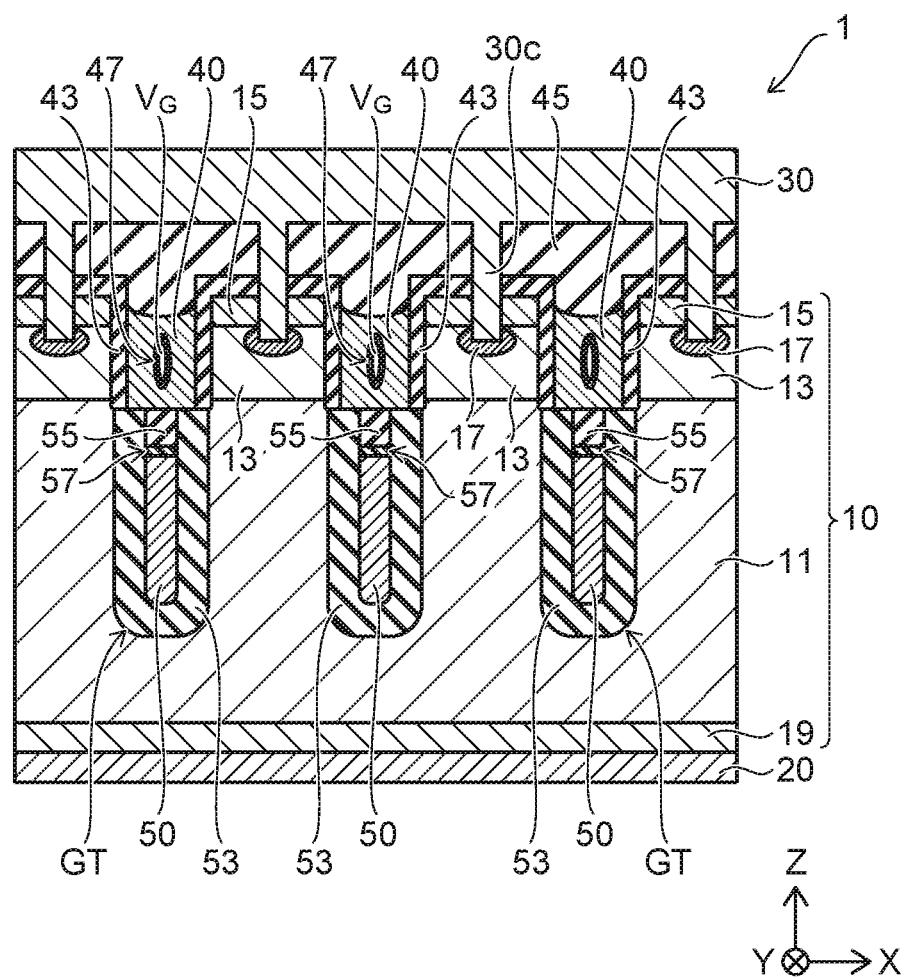
FIG. 1 is a schematic cross-sectional view showing a semiconductor device according to a first embodiment.

According to one embodiment, a semiconductor device includes a semiconductor part; a first electrode provided on a back surface of the semiconductor part; a second electrode provided on a front surface of the semiconductor part, the semiconductor part having a trench at the front surface side; and a control electrode provided between the semiconductor part and the second electrode. The control electrode is provided inside the trench of the semiconductor part. The control electrode is electrically insulated from the semiconductor part by a first insulating film and electrically insulated from the second electrode by a second insulating film. The control electrode includes an insulator provided at a position apart from the first insulating film and the second insulating film. The semiconductor part includes a first semiconductor layer of a first conductivity type, a second semiconductor layer of a second conductivity type, and a third semiconductor layer of the first conductivity type. The first semiconductor layer extends between the first electrode and the second electrode. The control electrode is provided between the first semiconductor layer and the second electrode. The second semiconductor layer is provided between the first semiconductor layer and the second electrode. The second semiconductor layer faces the control electrode via the first insulating film. The third semiconductor layer is selectively provided between the second semiconductor layer and the second electrode. The third semiconductor layer contacts the first insulating film. The third semiconductor layer is electrically connected to the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment. The semiconductor device 1 is, for example, a trench-gate MOS transistor.

As shown in FIG. 1, the semiconductor device 1 includes a semiconductor part 10, a first electrode (hereinbelow, a drain electrode 20), a second electrode (hereinbelow, a source electrode 30), a gate electrode 40, and a field plate electrode (hereinbelow, a FP electrode 50).

The semiconductor part 10 is, for example, silicon. The drain electrode 20 is provided on the back surface of the semiconductor part 10. The source electrode 30 is provided at the front surface of the semiconductor part 10. The gate electrode 40 and the FP electrode 50 are provided between the semiconductor part 10 and the source electrode 30. The gate electrode 40 and the FP electrode 50 are disposed inside a gate trench GT provided in the semiconductor part 10.

The FP electrode 50 is disposed at a position more proximate to the drain electrode 20 than the gate electrode 40. In other words, the distance between the drain electrode 20 and the FP electrode 50 is smaller than the distance between the drain electrode 20 and the gate electrode 40.

In the example, the FP electrode 50 is provided between the drain electrode 20 and the gate electrode 40. For example, the FP electrode 50 is electrically connected to the source electrode 30 at a portion not-illustrated.

The gate electrode 40 is electrically insulated from the semiconductor part 10 by a gate insulating film 43. Also, the gate electrode 40 is electrically insulated from the source electrode 30 by an inter-layer insulating film 45.

The FP electrode 50 is electrically insulated from the semiconductor part 10 by an insulating film 53. Also, the FP electrode 50 is electrically insulated from the gate electrode 40 by an insulating film 55 and an insulating film 57.

For example, the gate electrode 40 is provided between the inter-layer insulating film 45 and the insulating film 53 and between the inter-layer insulating film 45 and the insulating film 55.

The semiconductor part 10 includes a first semiconductor layer (hereinbelow, an n-type drift layer 11), a second semiconductor layer (hereinbelow, a p-type diffusion layer 13), a third semiconductor layer (hereinbelow, an n-type source layer 15), a p-type contact layer 17, and an n-type drain layer 19.

The n-type drift layer 11 extends between the drain electrode 20 and the source electrode 30. The gate electrode 40 is provided between the n-type drift layer 11 and the source electrode 30. The FP electrode 50 is provided in the n-type drift layer 11.

The p-type diffusion layer 13 is provided between the n-type drift layer 11 and the source electrode 30. The p-type diffusion layer 13 faces the gate electrode 40 via the gate insulating film 43.

The n-type source layer 15 is selectively provided between the p-type diffusion layer 13 and the source electrode 30. The n-type source layer 15 contacts the gate insulating film 43. The n-type source layer 15 includes an n-type impurity with a higher concentration than the concentration of the n-type impurity in the n-type drift layer 11. The n-type source layer 15 is electrically connected to the source electrode 30.

The p-type contact layer 17 is selectively provided between the p-type diffusion layer 13 and the source electrode 30. The p-type contact layer 17 includes a p-type impurity with a higher concentration than the concentration of the p-type impurity in the p-type diffusion layer 13. The p-type contact layer 17 is electrically connected to the source electrode 30.

In the example, the source electrode 30 includes an extending portion 30c. The source electrode 30 extends through the n-type source layer and reaches the p-type contact layer 17. The extending portion 30c contacts the n-type source layer 15 and the p-type contact layer 17. The extending portion 30c is electrically connected to the n-type source layer 15 and the p-type contact layer 17. The source electrode 30 is electrically connected to the p-type diffusion layer 13 via the p-type contact layer 17.

The n-type drain layer 19 is provided between the n-type drift layer 11 and the drain electrode 20. For example, the drain electrode 20 contacts the n-type drift layer 11 and is electrically connected to the n-type drift layer 11. The n-type drain layer 19 includes an n-type impurity with a higher concentration than the concentration of the n-type impurity in the n-type drift layer 11.

As shown in FIG. 1, the gate electrode 40 includes, for example, a so-called void $V_G$. The inner surface of the void $V_G$ is covered with an insulating film 47. Also, the insulating film 47 may be provided to fill the space inside the void $V_G$. The insulating film 47 is provided at a position apart from the gate insulating film 43, the inter-layer insulating film 45, the insulating film 53, and the insulating film 55. For example, the void $V_G$ is provided between the inter-layer insulating film 45 and the insulating film 55.

A method for manufacturing the semiconductor device 1 will now be described with reference to FIG. 2A to FIG. 7B. FIG. 2A to FIG. 7B are schematic cross-sectional views showing manufacturing processes of the semiconductor device 1 in order.

Figure 2A:
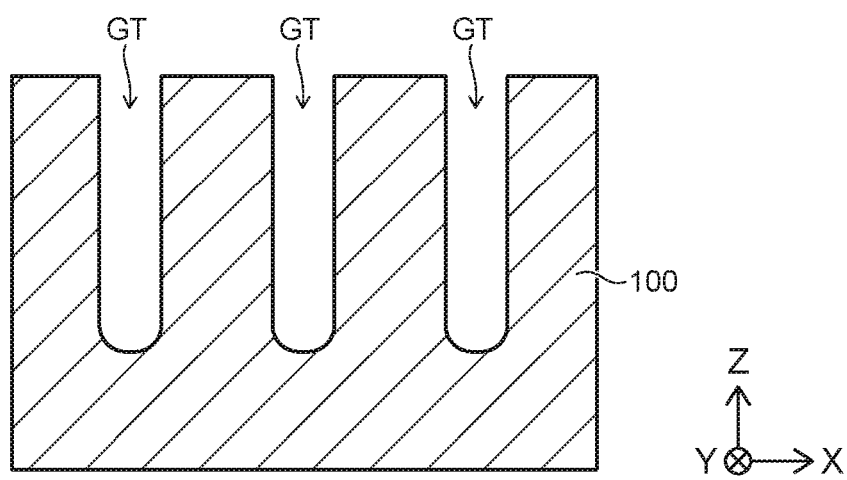

As shown in FIG. 2A, the gate trench GT is formed in the front side of a semiconductor wafer 100. For example, the gate trench GT is formed using anisotropic RIE (Reactive Ion Etching). The semiconductor wafer 100 is, for example, an n-type silicon wafer. The semiconductor wafer 100 includes an n-type impurity with the same concentration as the concentration of the n-type impurity in the n-type drift layer 11.

Figure 2B:
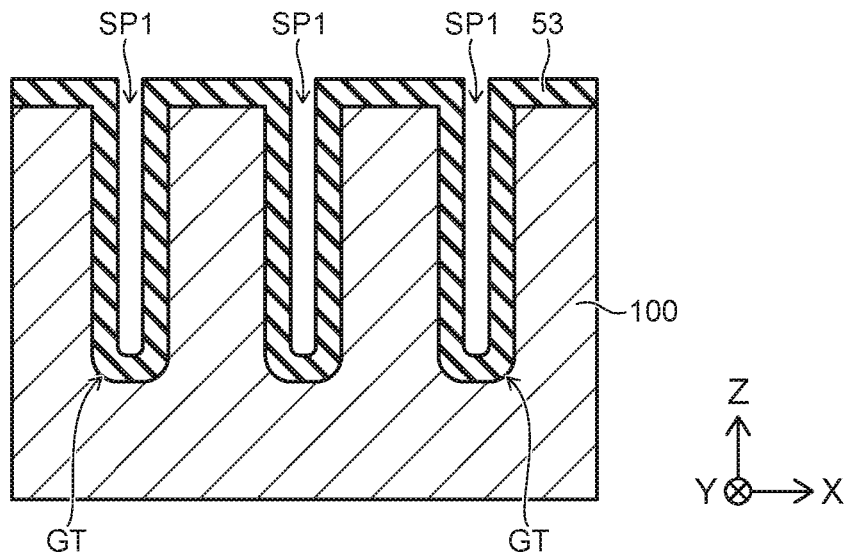

As shown in FIG. 2B, the insulating film 53 is formed to cover the interior of the gate trench GT. The insulating film 53 is formed so that a space SP1 remains inside the gate trench GT. The insulating film 53 is, for example, a silicon oxide film formed by thermal oxidation of the semiconductor wafer 100.

Figure 2C:
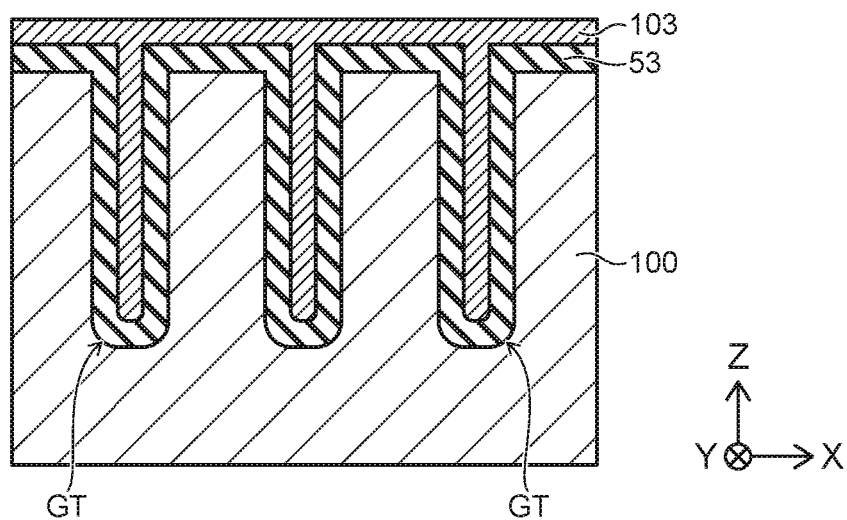

As shown in FIG. 2C, a conductive film 103 is formed at the front side of the semiconductor wafer 100. The conductive film 103 is formed to fill the space SP1 inside the gate trench GT. The conductive film 103 is, for example, a conductive polysilicon film and is formed using CVD (Chemical Vapor Deposition). The conductive film 103 includes, for example, phosphorus (P) as an n-type impurity.

Figure 3A:
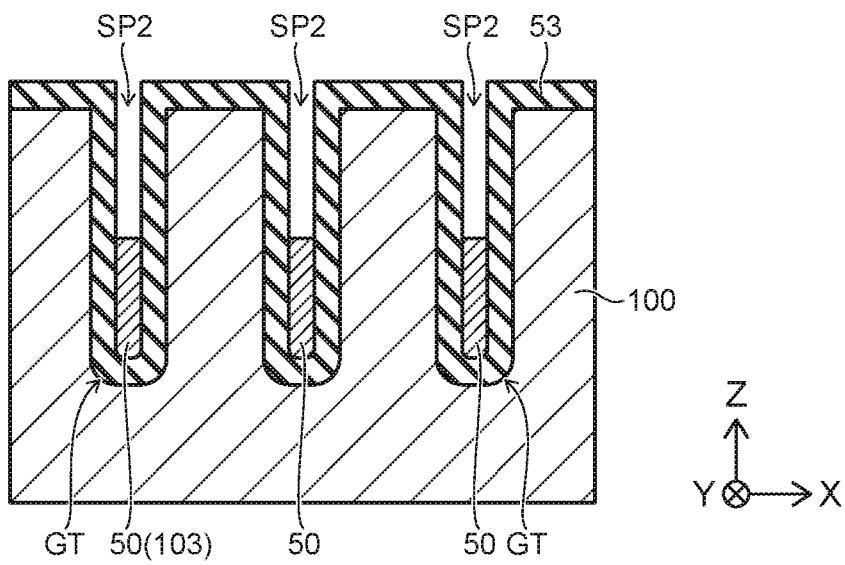

As shown in FIG. 3A, the conductive film 103 is selectively removed so that a portion thereof remains at the bottom portion of the gate trench GT. Thereby, the FP electrode 50 is formed at the bottom portion of the gate trench GT. Thus, a space SP2 is formed inside the gate trench GT.

Figure 3B:
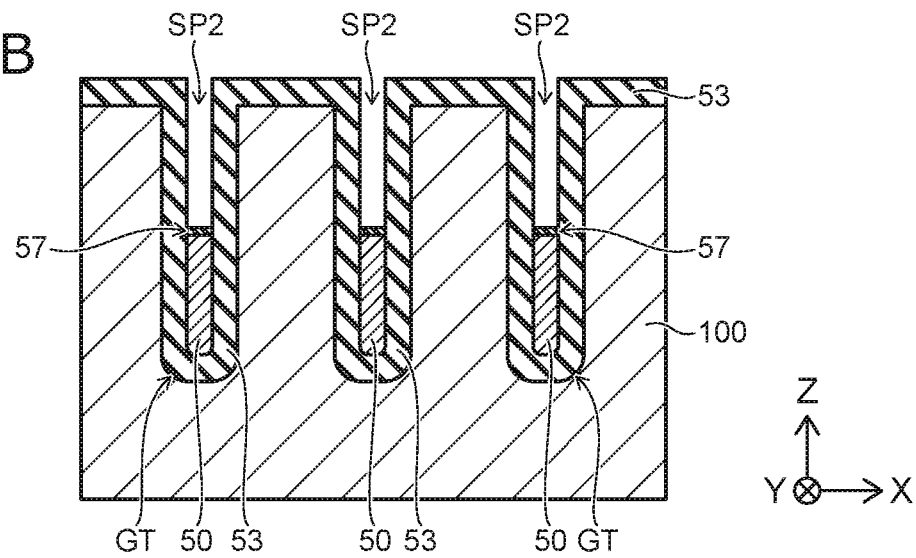

As shown in FIG. 3B, the insulating film 57 is formed at the upper end of the FP electrode 50. The insulating film 57 is, for example, a silicon oxide film. The insulating film 57 is formed by thermal oxidation of the FP electrode 50 via the space SP2.

Figure 3C:
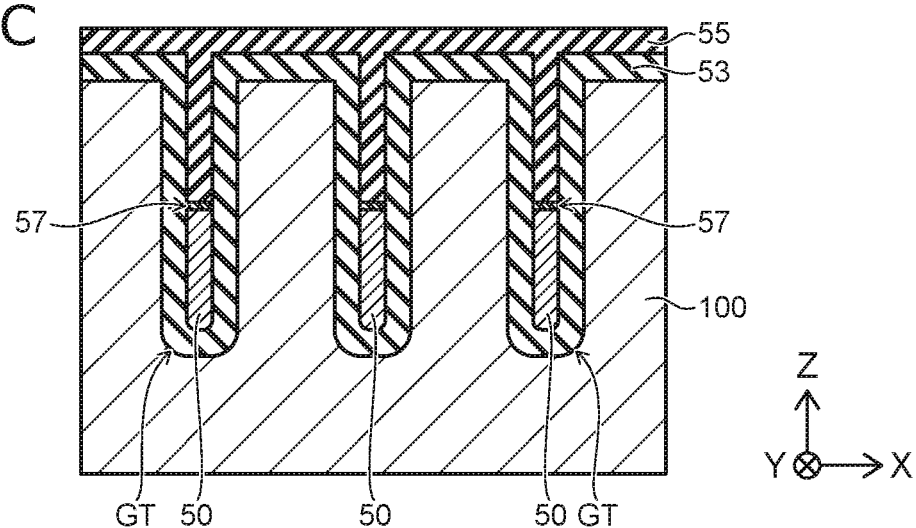

As shown in FIG. 3C, the insulating film 55 is formed at the front side of the semiconductor wafer 100. The insulating film 55 is formed to fill the space SP2 inside the gate trench GT. The insulating film 55 is, for example, a so-called BPSG film, i.e., a silicate glass film including boron (B) and phosphorus (P), and is formed using CVD.

Figure 4A:
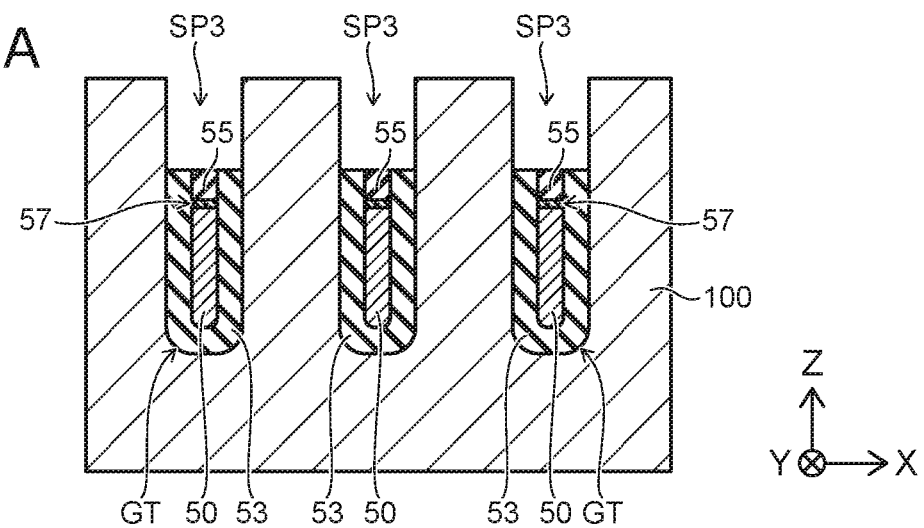

As shown in FIG. 4A, the insulating film 55 and the insulating film 53 are selectively removed so that the portions thereof remain inside the gate trench GT. The insulating film 53 is removed so that the upper end of the insulating film 53 is higher in the Z-direction than the upper end of the FP electrode 50. A portion of the insulating film 55 remains on the insulating film 57 above the FP electrode 50. For example, the insulating film 53 and the insulating film 55 are removed using wet etching. A space SP3 is formed in the upper portion of the gate trench GT.

Figure 4B:
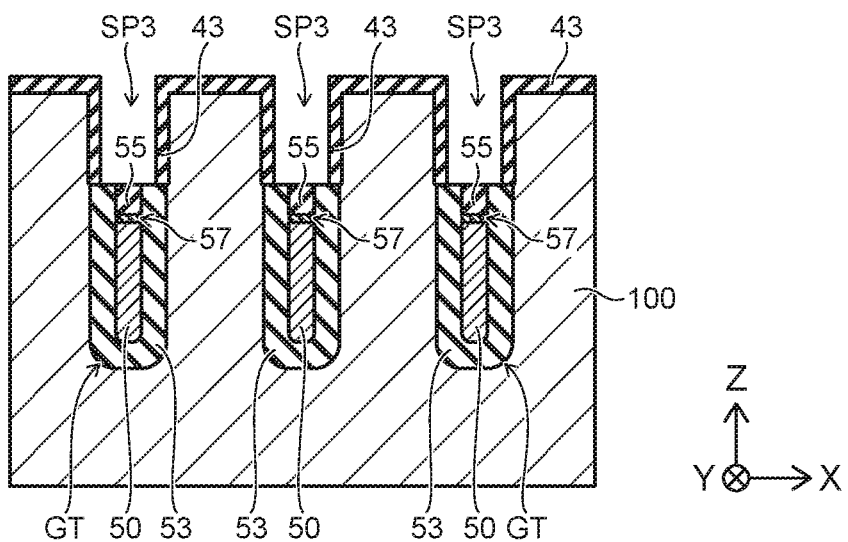

As shown in FIG. 4B, the gate insulating film 43 is formed to cover the exposed portion of the semiconductor wafer 100. The gate insulating film 43 is, for example, a silicon oxide film and is formed by thermal oxidation of the semiconductor wafer 100. The gate insulating film 43 is formed so that the space SP3 remains in the upper portion of the gate trench GT.

Figure 4C:
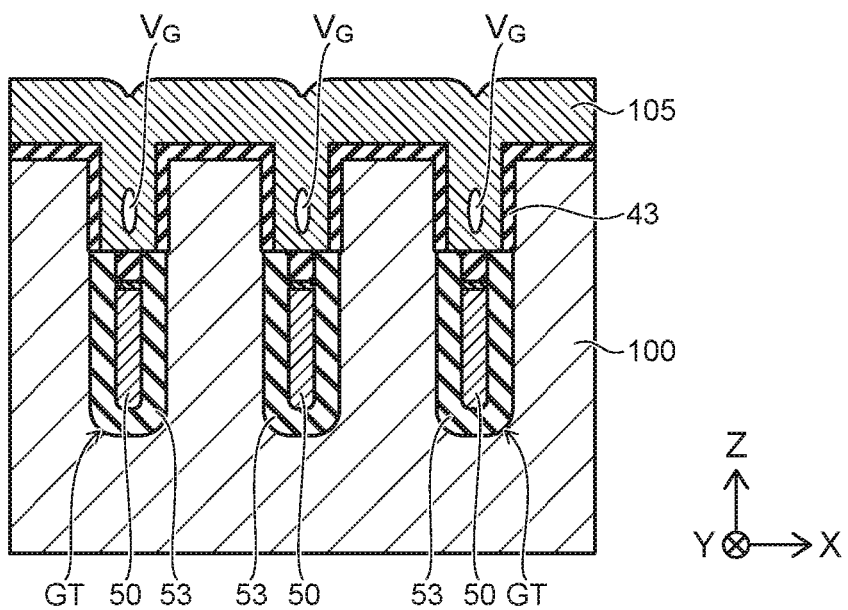

As shown in FIG. 4C, a conductive film 105 is formed at the front side of the semiconductor wafer 100. The conductive film 105 is formed to fill the space SP3 inside the gate trench GT. The conductive film 105 is formed using CVD and is, for example, a polysilicon film including phosphorus (P) as an n-type impurity. The gate insulating film 43 is positioned between the semiconductor wafer 100 and the conductive film 105.

The conductive film 105 may be formed to include the void $V_G$ inside the conductive film 105. For example, the conductive film 105 is formed using conditions such that the deposition rate at the opening of the space SP3 is faster than the deposition rate at the bottom of the space SP3. For example, the void $V_G$ is formed at the center of the space SP3 at a position apart from the gate insulating film 43, the insulating film 53, and the insulating film 55. For example, the void $V_G$ has a cross-sectional configuration in which the length in the Z-direction is greater than the width in the X-direction.

As shown in FIG. 5A, an insulating film 107 is formed by thermal oxidation of the conductive film 105. The insulating film 107 is, for example, a silicon oxide film. The insulating film 107 is formed to cover the exposed surface of the conductive film 105. In this process, the inner surface of the void $V_G$ also is oxidized, and the insulating film 47 is formed thereon. The insulating film 47 is, for example, a silicon oxide film.

For example, oxygen serves as an oxidizing agent penetrates inward along the grain boundaries in the polysilicon film. When the oxygen reaches the void $V_G$, the insulating film 47 is formed by oxidization of the silicon atoms exposed at the inner surface of the void $V_G$.

As shown in FIG. 5B, the front surface of the conductive film 105 is exposed by removing the insulating film 107. For example, the insulating film 107 is removed by wet etching.

As shown in FIG. 5C, the conductive film 105 is selectively removed so that the portion thereof remains in the space SP3 (referring to FIG. 4B). For example, the conductive film 105 is removed using dry etching or wet etching. Thereby, the gate electrode 40 is formed inside the gate trench GT.

Figure 6A:
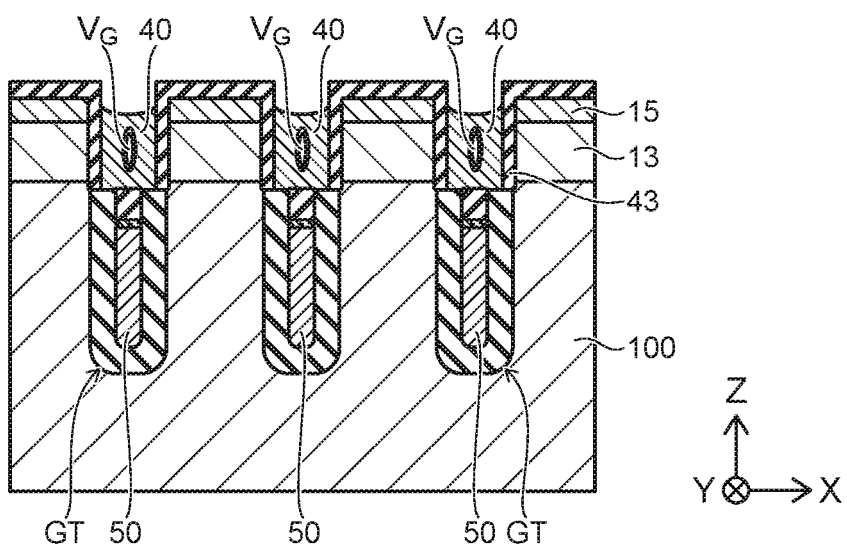

As shown in FIG. 6A, the p-type diffusion layer 13 and the n-type source layer 15 are formed at the front side of the semiconductor wafer 100.

The p-type diffusion layer 13 is formed using an ion-implantation. A p-type impurity such as boron (B) is implanted into the front surface of the semiconductor wafer 100. Subsequently, the p-type impurity is activated and diffused by heat treatment. The diffusion of the p-type impurity is controlled by the heat treatment time so that the interface between the n-type drift layer 11 and the p-type diffusion layer 13 is positioned at the same level in the Z-direction as the lower surface of the gate electrode 40 or at a higher level than the lower surface of the gate electrode 40.

For example, the n-type source layer 15 also is formed using an ion-implantation. An n-type impurity such as phosphorus (P) is implanted into the front surface of the semiconductor wafer 100 and subsequently activated by heat treatment.

Figure 6B:
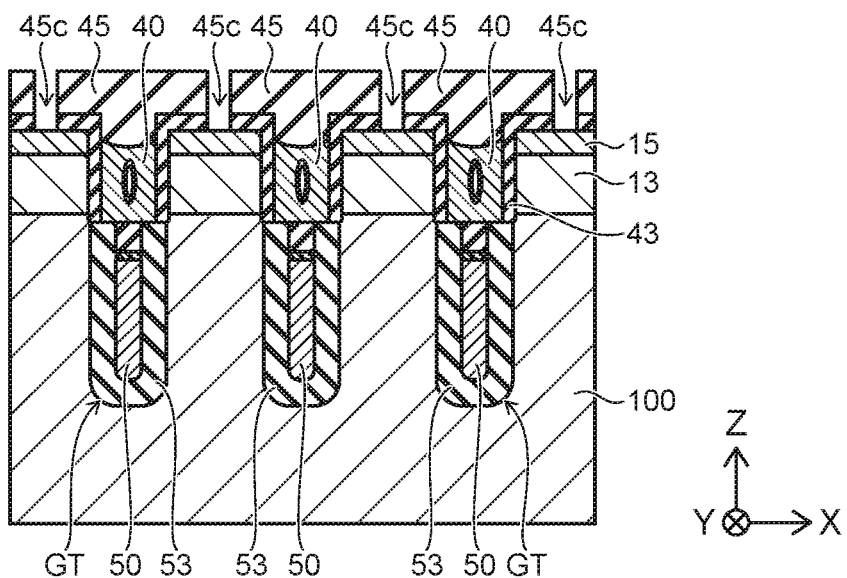

As shown in FIG. 6B, the inter-layer insulating film 45 is formed at the front side of the semiconductor wafer 100. The inter-layer insulating film 45 is formed to cover the gate electrode 40 and the gate insulating film 43. The inter-layer insulating film 45 is, for example, a silicon oxide film. The inter-layer insulating film 45 is formed using CVD.

A contact trench 45c is formed by selectively removing the gate insulating film 43 and the inter-layer insulating film 45. The contact trench 45c communicates with the n-type source layer 15 and extends along the gate electrode 40 in, for example, the Y-direction.

Figure 6C:
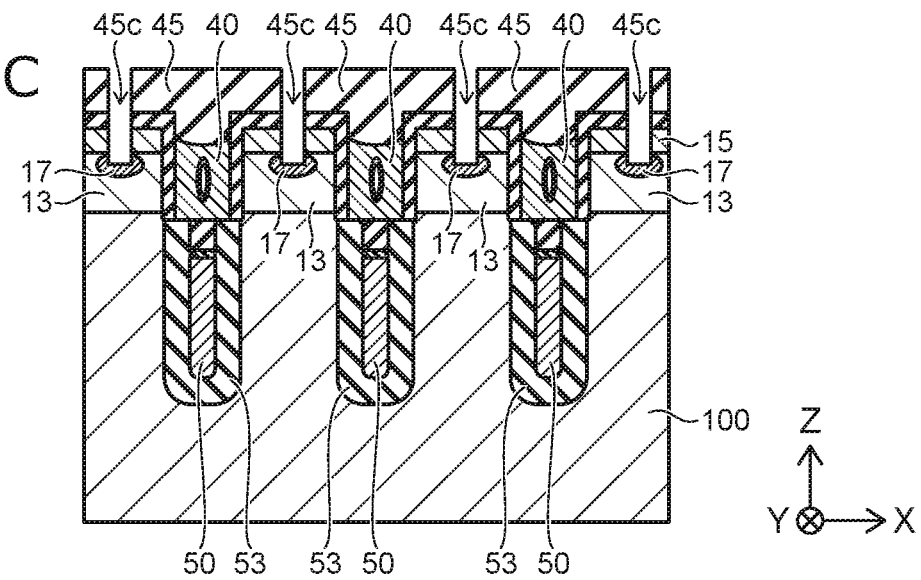

As shown in FIG. 6C, the n-type source layer 15 is selectively removed via the contact trench 45c, and the p-type diffusion layer 13 is exposed at the bottom surface of the contact trench 45c. Subsequently, the p-type contact layer 17 is formed using an ion-implantation. A p-type impurity such as boron is implanted via the contact trench 45c and heat-treated to be activated in the p-type diffusion layer 13.

Figure 7A:
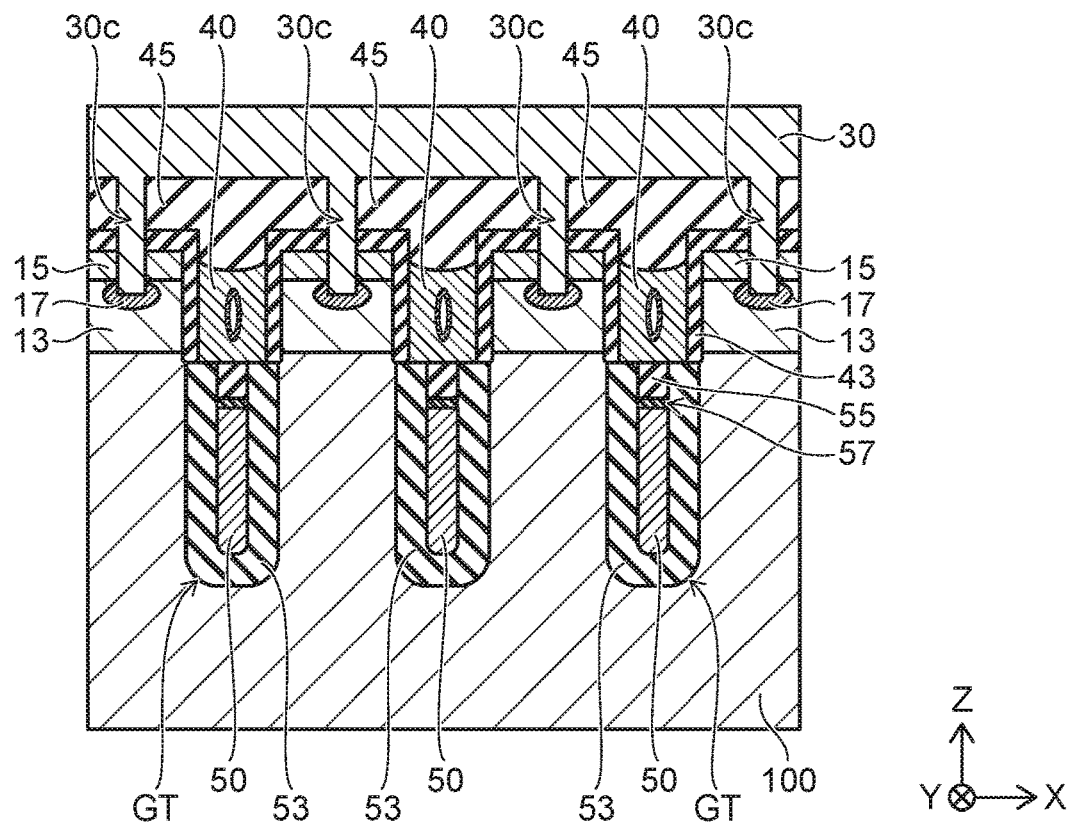

As shown in FIG. 7A, the source electrode 30 is formed at the front side of the semiconductor wafer 100. The source electrode 30 covers the inter-layer insulating film 45. The source electrode 30 is formed to include the extending portion 30c extending into the contact trench 45c. The source electrode 30 is, for example, a metal layer formed using sputtering. The source electrode 30 includes aluminum (Al).

Figure 7B:
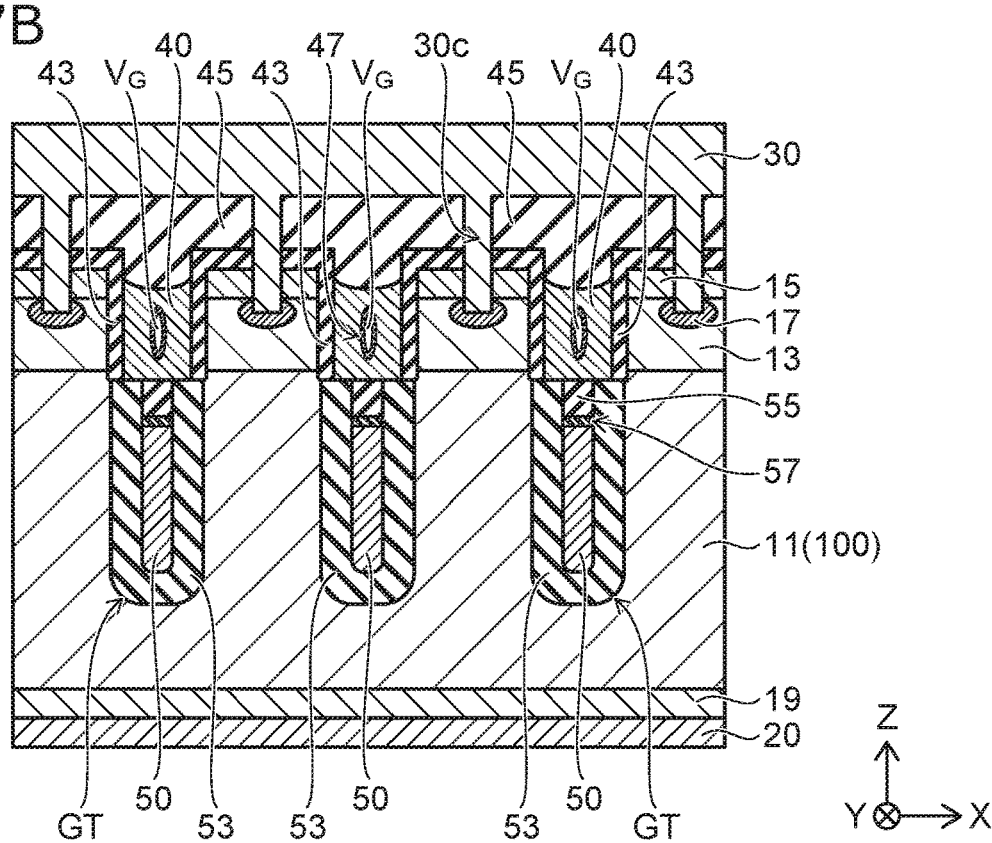

As shown in FIG. 7B, the semiconductor device 1 is completed by forming the n-type drain layer 19 and the drain electrode 20 at the back surface of the semiconductor wafer 100.

The n-type drain layer 19 is formed using an ion-implantation after the semiconductor wafer 100 is thinned to a prescribed thickness by polishing or etching the back surface. An n-type impurity such as phosphorus (P) is implanted into the back surface of the semiconductor wafer 100 and heat-treated. The portion of the semiconductor wafer 100 is the n-type drift layer 11, which is positioned between the p-type diffusion layer 13 and the n-type drain layer 19.

The drain electrode 20 is formed on the back surface of the n-type drain layer 19 by, for example, sputtering. The drain electrode 20 is, for example, a metal layer including titanium (Ti).

In the manufacturing method according to the embodiment, the insulating film 47 that covers the inner surface of the void $V_G$ is formed by the thermal oxidation of the conductive film 105 (referring to FIG. 5A). Thereby, in the process shown in FIG. 5A and subsequent manufacturing processes, the void $V_G$ can be stable under the heat treatment. The insulating film 47 may be formed to plug the void $V_G$. In other words, there are also cases where a space does not remain inside the void $V_G$ after the insulating film 47 is formed.

For example, when the insulating film 47 is not formed, the silicon atoms that are exposed at the inner surface of the void $V_G$ desorb due to heat treatment and re-adhere inside the void $V_G$. Repeating the desorption and re-adhesion changes the position of the void $V_G$ inside the gate electrode 40; for example, there are cases where the void $V_G$ is positioned at the vicinity of the gate insulating film 43. As a result, the void $V_G$ changes the gate threshold voltage, the channel resistance, etc., and degrades the transistor characteristics.

In contrast, the desorption of the silicon atoms is suppressed in the semiconductor device 1 because the inner surface of the void $V_G$ is covered by the insulating film 47. The movement of the void $V_G$ can be prevented thereby. In other words, in the semiconductor device 1, the void $V_G$ maintains a position apart from the gate insulating film 43 and may not affect the transistor characteristics.

Figure 8A:
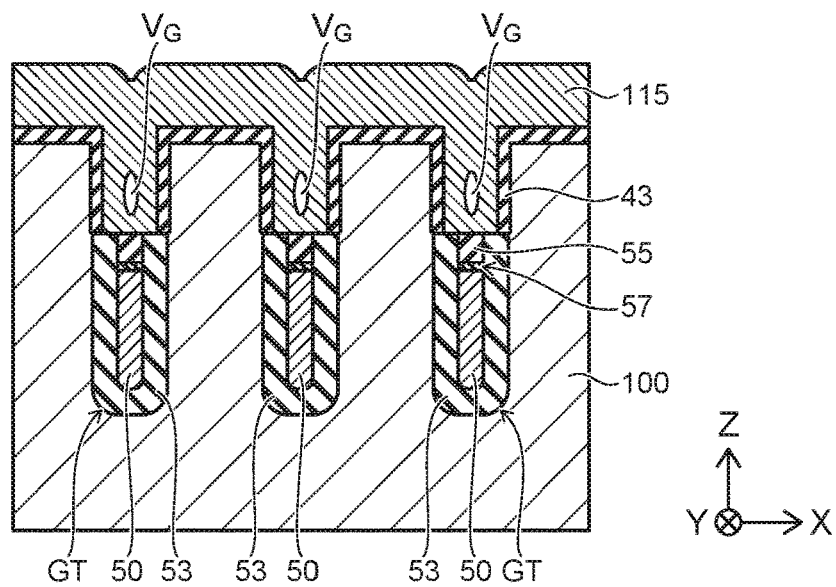
FIGS. 8A to 8C are schematic cross-sectional views showing manufacturing processes of the semiconductor device according to a modification of the first embodiment.
Figure 8B:
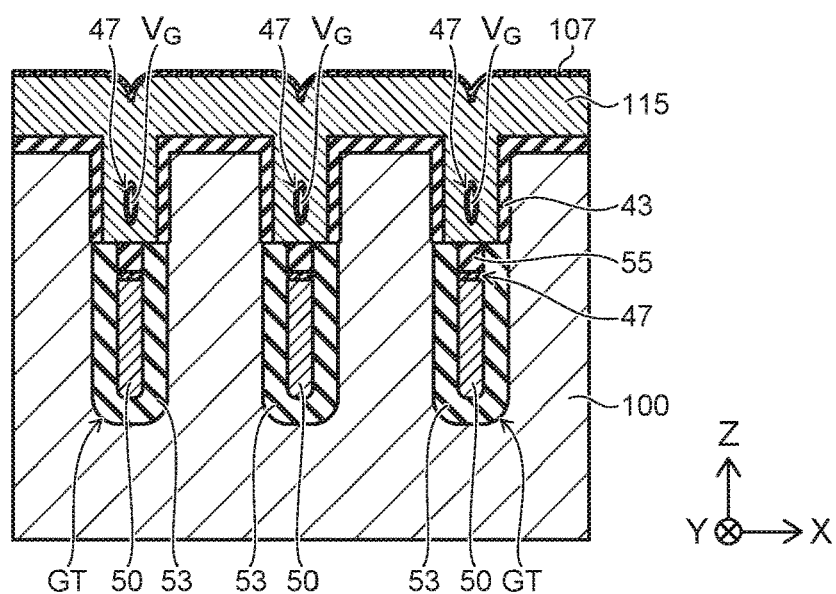
Figure 8C:
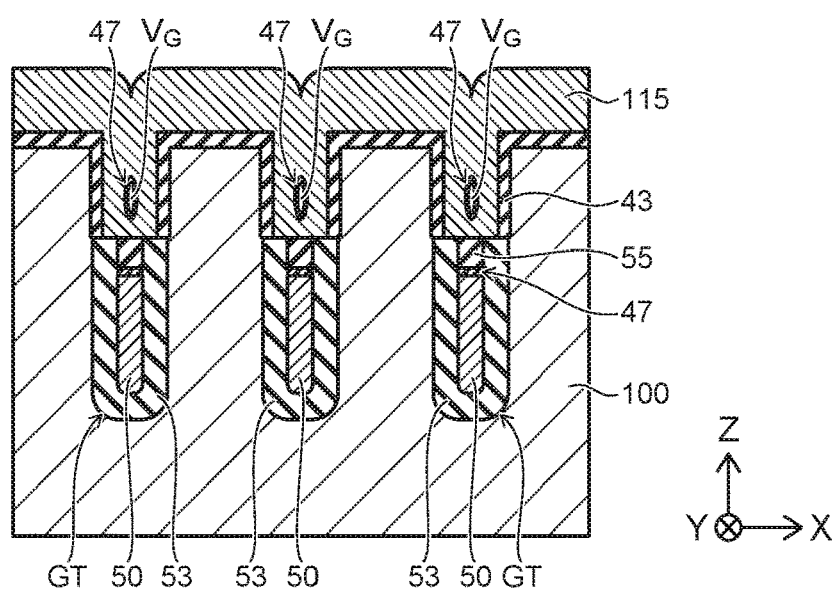

A method for manufacturing the semiconductor device 1 according to a modification of the first embodiment will now be described with reference to FIGS. 8A to 8C. FIGS. 8A to 8C are schematic cross-sectional views showing manufacturing processes continuing from FIG. 4B.

As shown in FIG. 8A, a polysilicon layer 115 is formed without the impurity-doping at the front side of the semiconductor wafer 100. The polysilicon layer 115 is formed to fill the space SP3 at the upper portion of the gate trench GT. The polysilicon layer 115 includes the void $V_G$ at a portion thereof in the space SP3.

As shown in FIG. 8B, the front surface of the polysilicon layer 115 is covered by forming the insulating film 107 by the thermal oxidation of the polysilicon layer 115. In this process, the insulating film 47 also is formed to cover the inner surface of the void $V_G$.

As shown in FIG. 8C, after removing the insulating film 107, an n-type impurity such as phosphorus (P) is diffused into the polysilicon layer 115. For example, phosphorus (P)

is diffused into the polysilicon by heat treatment in an atmosphere of inert gas such as $N_2$ including phosphine ($PH_3$), etc. Phosphorus (P) may be ion-implanted into the polysilicon and diffused by heat treatment. Alternatively, another polysilicon layer including phosphorus (P) may be formed on the non-doped polysilicon to diffuse the phosphorus (P) into the non-doped polysilicon by heat treatment. The polysilicon layer 115 is conductive thereby.

Continuing, the polysilicon layer 115 is removed so that the portion of the polysilicon layer 115 remains in the space SP3 (referring to FIG. 5C). Subsequently, the semiconductor device 1 is completed through the manufacturing processes shown in FIG. 6A to FIG. 7B.

In the example, the resistance to the heat treatment is improved by covering the inner surface of the void $V_G$ with the insulating film 47. For example, the movement of the void $V_G$ can be suppressed in the process of diffusing the n-type impurity into the polysilicon layer 115.

Figure 9A:
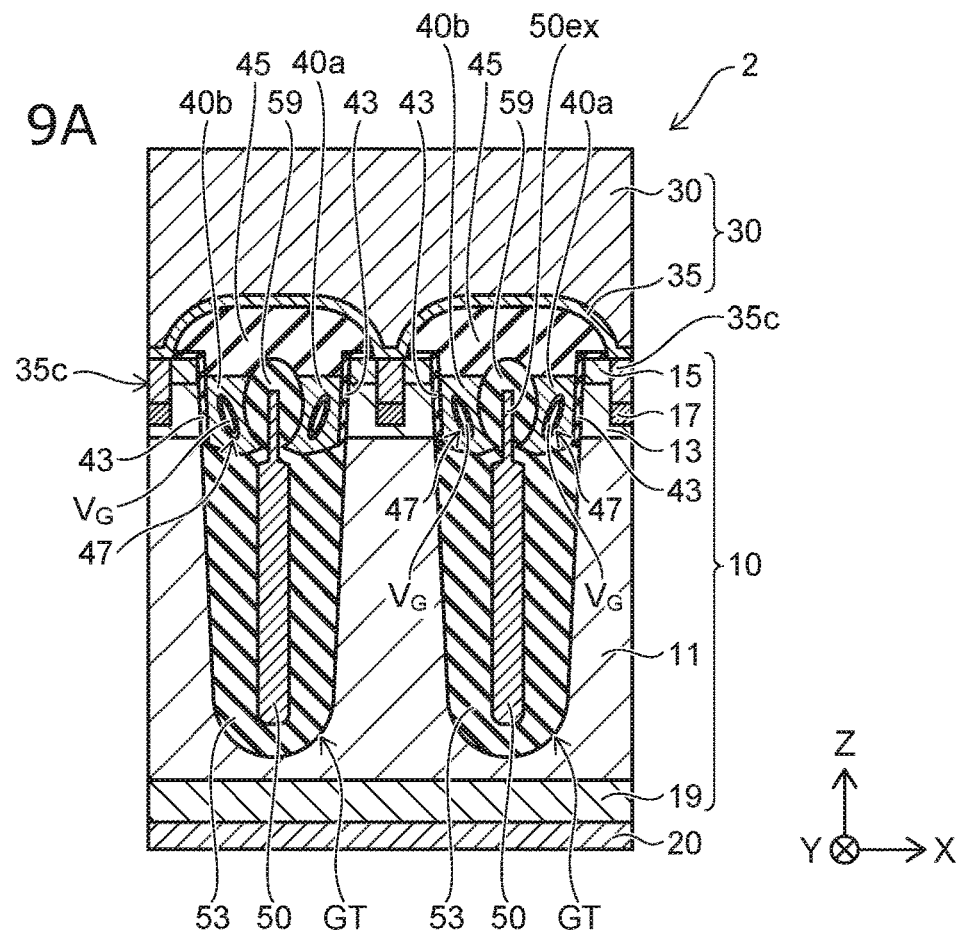
FIGS. 9A and 9B are schematic cross-sectional views showing semiconductor devices according to a modification of the first embodiment.
Figure 9B:
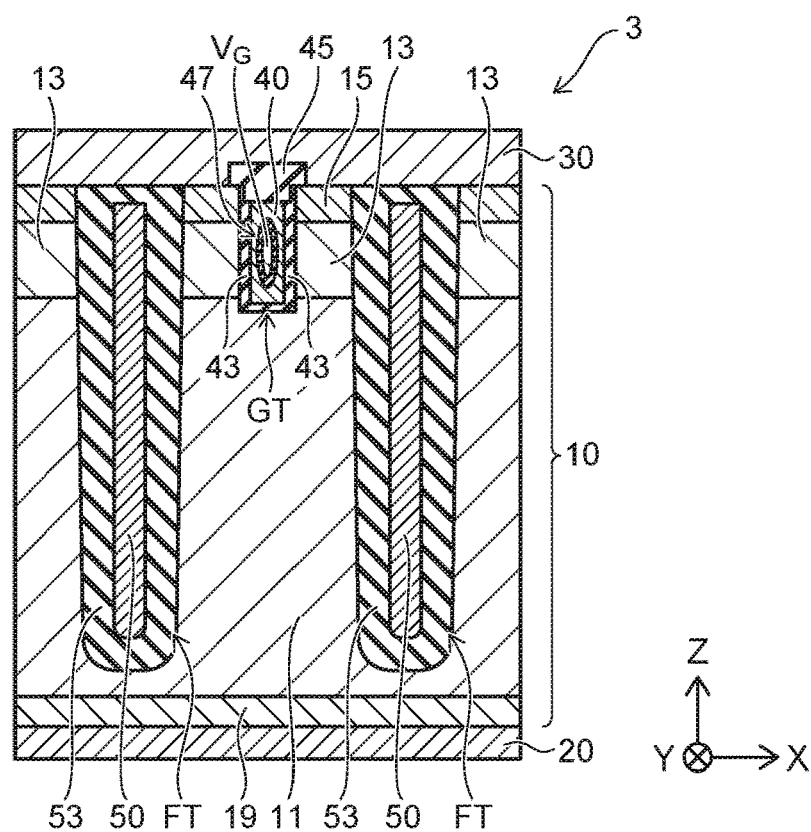

FIGS. 9A and 9B are schematic cross-sectional views showing semiconductor devices 2 and 3 according to modifications of the first embodiment.

The semiconductor device 2 shown in FIG. 9A includes a gate electrode 40a (a first control portion) and a gate electrode 40b (a second control portion). The gate electrodes 40a and 40b are provided in the gate trench GT with the FP electrode 50 interposed.

The gate electrodes 40a and 40b each face the p-type diffusion layer 13 via the gate insulating film 43. The FP electrode 50 includes a major portion that faces the n-type drift layer 11 via the insulating film 53, and an extending portion 50ex extending between the gate electrode 40a and the gate electrode 40b. The extending portion 50ex is electrically insulated from the gate electrodes 40a and 40b by an insulating film 59. The insulating film 59 is provided between the gate electrode 40a and the gate electrode 40b.

The gate electrodes 40a and 40b are electrically insulated from the source electrode 30 by the inter-layer insulating film 45. The gate electrodes 40a and 40b each are provided between the inter-layer insulating film 45 and the insulating film 53, Also, the gate electrodes 40a and 40b each are provided between the gate insulating film 43 and the insulating film 59.

The source electrode 30 has a stacked structure including a bonding layer 33 and a contact layer 35. The bonding layer 33 is, for example, a metal layer including aluminum (Al). The contact layer 35 is provided between the bonding layer 33 and the inter-layer insulating film 45. The contact layer 35 is, for example, a metal layer including titanium (Ti).

The contact layer 35 includes an extending portion 35c reaching the p-type contact layer 17. The source electrode 30 is electrically connected to the n-type source layer 15 and the p-type contact layer 17 via the extending portion 35c.

In the example as well, the gate electrodes 40a and 40b include the voids $V_G$, and the inner surfaces of the voids $V_G$ are covered with the insulating film 47. In each of the gate electrodes 40a and 40b, the void $V_G$ is provided at a position apart from the gate insulating film 43, the inter-layer insulating film 45, the insulating film 53, and the insulating film 59. The void $V_G$ is positioned between the gate insulating film 43 and the insulating film 59 and between the inter-layer insulating film 45 and the insulating film 53. The insulating film 47 suppresses the movement of the void $V_G$ due to the heat treatment, and thereby, prevents the degradation of the transistor characteristics.

The semiconductor device 3 shown in FIG. 9B includes the gate trench GT and a field trench FT.

The gate electrode 40 is provided in the gate trench GT. The gate electrode 40 is electrically insulated from the semiconductor part 10 by the gate insulating film 43. Also, the gate electrode 40 is electrically insulated from the source electrode 30 by the inter-layer insulating film 45.

The FP electrode 50 is provided in the field trench FT. The FP electrode 50 is electrically insulated from the semiconductor part 10 by the insulating film 53. For example, the gate electrode 40 is provided between the FP electrodes 50 adjacent to each other in a direction along the front surface of the semiconductor part 10. For example, the FP electrode 50 is electrically connected to the source electrode 30 at a portion not-illustrated.

In the example as well, the gate electrode 40 includes the void $V_G$. The inner surface of the void $V_G$ is covered with the insulating film 47. The void $V_G$ is provided at a position apart from the gate insulating film 43 and the inter-layer insulating film 45. The void $V_G$ is stabilized by the insulating film 47 in the heat treatment and maintains a position thereof so as not to affect the transistor characteristics.

Second Embodiment

Figure 10:
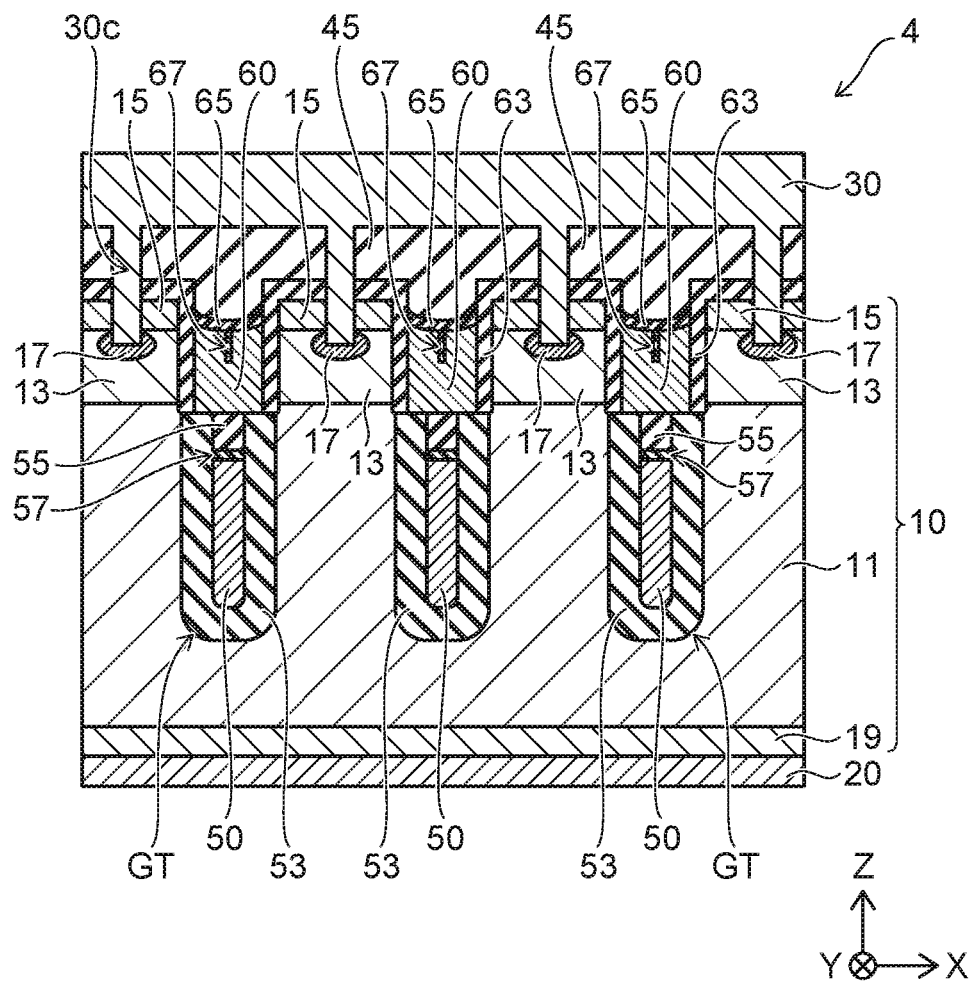
FIG. 10 is a schematic cross-sectional view showing a semiconductor device according to a second embodiment.

FIG. 10 is a schematic cross-sectional view showing a semiconductor device 4 according to a second embodiment. The semiconductor device 4 includes a gate electrode 60 and the FP electrode 50 provided inside the gate trench GT. The FP electrode 50 is provided at a position more proximate to the drain electrode 20 than the gate electrode 60. That is, the distance between the drain electrode 20 and the FP electrode 50 is smaller than the distance between the drain electrode 20 and the gate electrode 60.

In the example, the FP electrode 50 is provided between the drain electrode 20 and the gate electrode 60. The FP electrode 50 is electrically insulated from the semiconductor part 10 by the insulating film 53. The FP electrode 50 is electrically insulated from the gate electrode 60 by the insulating films 55 and 57.

The gate electrode 60 is provided between the source electrode 30 and the FP electrode 50. The gate electrode 60 is electrically insulated from the source electrode 30 by the inter-layer insulating film 45. Also, the gate electrode 60 is electrically insulated from the semiconductor part 10 by a gate insulating film 63.

As shown in FIG. 10, the semiconductor device 4 further includes an insulating film 65 provided between the inter-layer insulating film 45 and the gate electrode 60. The insulating film 65 includes a protrusion 67 protruding into the gate electrode 60.

For example, the protrusion 67 is positioned between the inter-layer insulating film 45 and the insulating film 55 and extends toward the insulating film 55. For example, the length in the Z-direction of the protrusion 67 is less than the distance from the tip of the protrusion 67 to the lower end of the gate electrode 60. For example, the insulating film 65 may include the same material as the material of the inter-layer insulating film 45. The insulating film 65 may be provided to have a continuous body with the inter-layer insulating film 45.

A method for manufacturing the semiconductor device 4 will now be described with reference to FIG. 11A to FIG. 12C. FIGS. 11A to 12C are schematic cross-sectional views showing manufacturing processes continuing from FIG. 4B.

As shown in FIG. 11A, a conductive film 123 is formed at the front side of the semiconductor wafer 100. The conductive film 123 covers the inner surface of the space SP1 in the upper portion of the gate trench GT. The conductive film 123 is, for example, a polysilicon film including an n-type impurity such as phosphorus (P). For example, the conductive film 123 is formed using CVD.

As shown in FIG. 11B, the space SP3 becomes narrow as the conductive film 123 becomes thicker.

As shown in FIG. 11C, the conductive film 123 is formed to be thick enough to plug the space SP3. As a result, the conductive film 123 is formed to include a seam SM inside the conductive film 123. For example, the seam SM is formed by the portions of the conductive film 123 contacting each other that are deposited on the inner walls of two sides of the space SP3.

In the example, the conductive film 123 includes the seam SM but does not include the void $V_G$ shown in FIG. 4C. For example, such a difference is dependent on the configuration or the size of the space SP3. For example, the space SP3 has a width $W_{GT}$ at the position near the opening and a width $W_{BT}$ at the bottom. When the width $W_{GT}$ is greater than the width $W_{BT}$, the void $V_G$ is not formed, and thus, the conductive film 123 includes the seam SM.

As shown in FIG. 12A, the conductive film 123 is removed so that a portion of the conductive film 123 remains in the space SP3. The portion of the conductive film 123 remaining in the space SP3 is the gate electrode 60.

As shown in FIG. 12B, the insulating film 65 is formed on the gate electrode 60 by thermal oxidation. The insulating film 65 is, for example, a silicon oxide film. The insulating film 65 is formed to cover the upper surface of the gate electrode 60. The insulating film 65 includes the protrusion 67 extending into the gate electrode 60.

The protrusion 67 of the insulating film 65 is formed along the seam SM. For example, the protrusion 67 is formed by oxidizing the silicon atoms positioned at the seam SM. The oxygen serving as an oxidizing agent penetrates into the gate electrode along the seam SM.

As shown in FIG. 12C, the p-type diffusion layer 13 and the n-type source layer 15 are formed by the ion-implantations. The p-type and n-type impurities are respectively implanted into the front side of the semiconductor wafer 100 and activated by the heat treatments. Continuing, the semiconductor device 4 is completed through the manufacturing processes shown in FIG. 6A to FIG. 7B.

In the example, the width in the X-direction of the gate electrode 60 is widened by the protrusion 67 of the insulating film 65 formed inside the gate electrode 60. Therefore, stress is applied to the p-type diffusion layer 13 and the n-type source layer 15 between the gate electrodes 60 adjacent to each other in the X-direction, and strain is generated in the semiconductor crystal of the p-type diffusion layer 13 and the n-type source layer 15. As a result, for example, the electron mobility increases in the p-type diffusion layer 13. Thereby, it is possible to reduce the electrical resistance to the ON-current flowing through the inversion channel, which is induced at the interface between the p-type diffusion layer 13 and the gate insulating film 63.

Figure 13A:
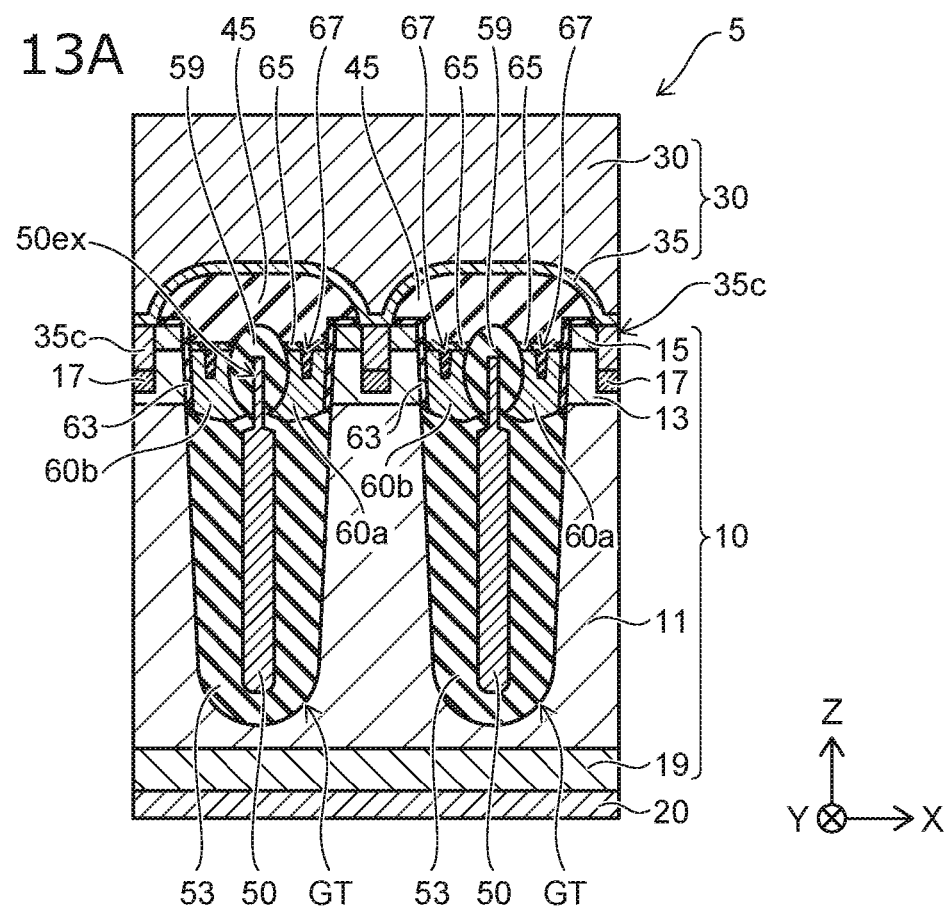
FIGS. 13A and 13B are schematic cross-sectional views showing semiconductor devices according to a modification of the second embodiment.
Figure 13B:
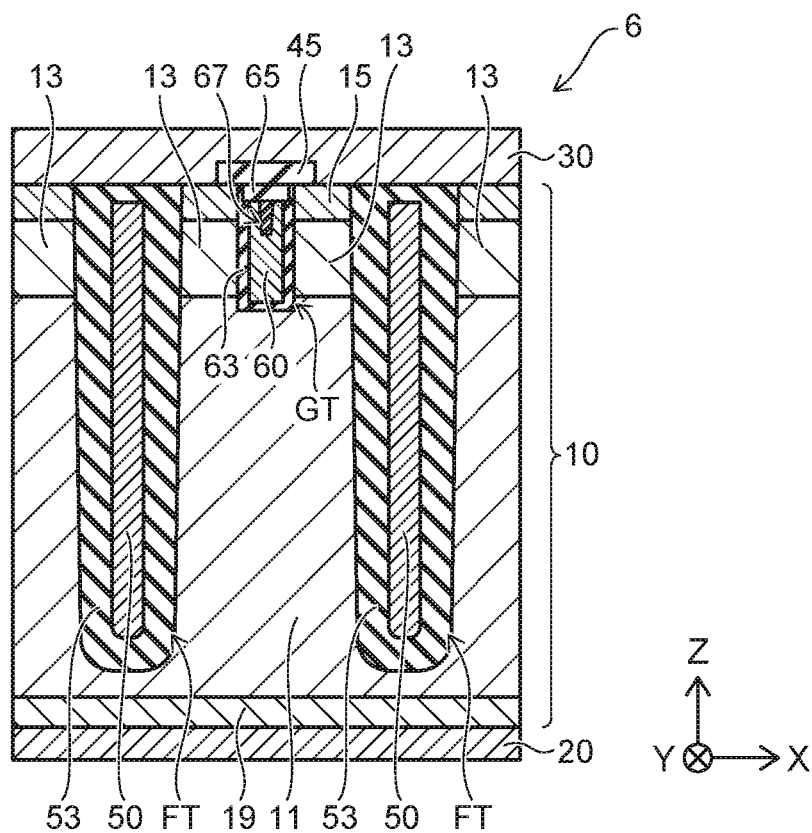

FIGS. 13A and 13B are schematic cross-sectional views showing semiconductor devices 5 and 6 according to modifications of the second embodiment.

The semiconductor device 5 shown in FIG. 13A includes gate electrodes 60a and 60b. The gate electrodes 60a and 60b are provided in the gate trench GT with the FP electrode 50 interposed.

The gate electrodes 60a and 60b each face the p-type diffusion layer 13 via the gate insulating film 63. The FP electrode 50 includes the extending portion 50ex extending between the gate electrode 60a and the gate electrode 60b.

The extending portion 50ex is electrically insulated from the gate electrodes 60a and 60b by the insulating film 59.

The gate electrodes 60a and 60b are electrically insulated from the source electrode 30 by the inter-layer insulating film 45. The source electrode 30 has a stacked structure including the bonding layer 33 and the contact layer 35. The contact layer 35 includes the extending portion 35c reaching the p-type contact layer 17. The source electrode 30 is electrically connected to the n-type source layer 15 and the p-type contact layer 17 via the extending portion 35c.

In the example as well, the insulating film 65 is provided between the inter-layer insulating film 45 and the gate electrode 60a and between the inter-layer insulating film 45 and the gate electrode 60b. The insulating films 65 include the protrusions 67 extending into the gate electrodes 60a and 60b.

The protrusions 67 are provided between the inter-layer insulating film 45 and the insulating film 53 and extend toward the insulating film 53. For example, the lengths along the extension directions of the protrusions 67 are less than the distances from the tips of the protrusions 67 to the lower ends of the gate electrodes 60a and 60b. For example, stress is applied to the p-type diffusion layer 13 and the n-type source layer 15 by the protrusions 67, and the electrical resistance can be reduced in the inversion channel induced at the interface between the p-type diffusion layer 13 and the gate insulating film 63.

The semiconductor device 6 shown in FIG. 13B includes the gate trench GT and the field trench FT.

The gate electrode 60 is provided in the gate trench GT and is electrically insulated from the semiconductor part 10 by the gate insulating film 63. Also, the gate electrode 60 is provided between the semiconductor part 10 and the source electrode 30 and is electrically insulated from the source electrode 30 by the inter-layer insulating film 45.

The FP electrode 50 is provided inside the field trench FT and electrically insulated from the semiconductor part 10 by the insulating film 53. For example, the FP electrode 50 is electrically connected to the source electrode 30 at a portion not-illustrated.

In the example as well, the insulating film 65 is provided between the inter-layer insulating film 45 and the gate electrode 60. The insulating film 65 includes the protrusion 67 extending into the gate electrode 60. For example, the length in the Z-direction of the protrusion 67 is less than the distance from the tip of the protrusion 67 to the lower end of the gate electrode 60. Thereby, stress is applied to the p-type diffusion layer 13 and the n-type source layer 15, and the electrical resistance can be reduced in the inversion channel induced at the interface between the p-type diffusion layer 13 and the gate insulating film 63.

The embodiments described above are effective also for structures in which the FP electrode 50 is not provided. For example, the semiconductor devices 3 and 6 may have a structure in which the field trench FT and the FP electrode 50 are not provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part;
a first electrode provided on a back surface of the semiconductor part;
a second electrode provided on a front surface of the semiconductor part, the semiconductor part having a trench at the front surface side; and
a control electrode provided between the semiconductor part and the second electrode, the control electrode being provided inside the trench of the semiconductor part, the control electrode being electrically insulated from the semiconductor part by a first insulating film and electrically insulated from the second electrode by a second insulating film, the control electrode including an insulator provided at a position apart from the first insulating film and the second insulating film,
the semiconductor part including a first semiconductor layer of a first conductivity type, a second semiconductor layer of a second conductivity type, and a third semiconductor layer of the first conductivity type,
the first semiconductor layer extending between the first electrode and the second electrode, the control electrode being provided between the first semiconductor layer and the second electrode,
the second semiconductor layer being provided between the first semiconductor layer and the second electrode, the second semiconductor layer facing the control electrode via the first insulating film,
the third semiconductor layer being selectively provided between the second semiconductor layer and the second electrode, the third semiconductor layer contacting the first insulating film, the third semiconductor layer being electrically connected to the second electrode,
the second electrode including a contact portion extending through the third semiconductor layer, the contact portion of the second electrode contacting the third semiconductor layer and having a bottom in the second semiconductor layer, the insulator and the bottom of the contact portion of the second electrode being arranged in a direction directed along a boundary between the first semiconductor layer and the second semiconductor layer.

2. The device according to claim 1, further comprising:
a third electrode provided inside the trench of the semiconductor part, a distance between the first electrode and the third electrode being smaller than a distance between the first electrode and control electrode, the third electrode being electrically insulated from the semiconductor part by a fourth insulating film and electrically insulated from the control electrode by a fifth insulating film,
the insulator being provided at the position apart from the fourth insulating film and the fifth insulating film.

3. The device according to claim 1, wherein
the control electrode includes a void at the position apart from the first insulating film and the second insulating film; and
the insulator covers an inner surface of the void.

4. The device according to claim 2, wherein
the third electrode is provided between the first electrode and the control electrode, the third electrode facing the first semiconductor layer of the semiconductor part via the fourth insulating film; and the control electrode is provided between the second insulating film and the fourth insulating film and between the second insulating film and the fifth insulating film.

5. The device according to claim 4, wherein the insulator is provided between the second insulating film and the fifth insulating film.

6. The device according to claim 4, wherein
the insulator has a length in a direction from the first electrode toward the second electrode and a width in a direction from the second semiconductor layer of the semiconductor part toward the control electrode; and
the length is greater than the width in the insulator.

7. A semiconductor device, comprising:
a semiconductor part;
a first electrode provided on a back surface of the semiconductor part;
a second electrode provided on a front surface of the semiconductor part, the semiconductor part having a trench at the front surface side;
a control electrode provided between the semiconductor part and the second electrode, the control electrode being provided inside the trench of the semiconductor part, the control electrode being electrically insulated from the semiconductor part by a first insulating film and electrically insulated from the second electrode by a second insulating film, the control electrode including an insulator provided at a position apart from the first insulating film and the second insulating film; and
a third electrode provided inside the trench of the semiconductor part, a distance between the first electrode and the third electrode being smaller than a distance between the first electrode and control electrode, the third electrode being electrically insulated from the semiconductor part by a fourth insulating film and electrically insulated from the control electrode by a fifth insulating film,
the insulator being provided at the position apart from the fourth insulating film and the fifth insulating film,
the semiconductor part including a first semiconductor layer of a first conductivity type, a second semiconductor layer of a second conductivity type, and a third semiconductor layer of the first conductivity type,
the first semiconductor layer extending between the first electrode and the second electrode, the control electrode being provided between the first semiconductor layer and the second electrode,
the second semiconductor layer being provided between the first semiconductor layer and the second electrode, the second semiconductor layer facing the control electrode via the first insulating film,
the third semiconductor layer being selectively provided between the second semiconductor layer and the second electrode, the third semiconductor layer contacting the first insulating film, the third semiconductor layer being electrically connected to the second electrode,
wherein the control electrode includes a first control portion and a second control portion, the first and second control portions being arranged in a direction from the second semiconductor layer of the semiconductor part toward the control electrode;
the third electrode includes a first portion and a second portion, the first portion facing the first semiconductor layer of the semiconductor part via the fourth insulating film, the second portion extending between the first control portion and the second control portion;

the second portion of the third electrode is electrically insulated from the control electrode by the fifth insulating film provided between the first control portion and the second control portion; and the first control portion and the second control portion each are provided between the second insulating film and the fourth insulating film.

8. The device according to claim 7, wherein
the insulator is provided between the first insulating film and the fifth insulating film and between the second insulating film and the fourth insulating film.

9. The device according to claim 1, wherein
the control electrode includes polysilicon, and the insulator is a silicon oxide film.

10. A semiconductor device, comprising:
a semiconductor part;
a first electrode provided on a back surface of the semiconductor part;
a second electrode provided on a front surface of the semiconductor part, the semiconductor part having a trench at the front surface side;
a control electrode provided between the semiconductor part and the second electrode, the control electrode being provided in the trench of the semiconductor part;
a first insulating film electrically insulating the control electrode from the semiconductor part;
a second insulating film electrically insulating the control electrode from the second electrode, the second insulating film including a protrusion extending inside the control electrode; and
a third electrode provided inside the trench of the semiconductor part with the control electrode,
the semiconductor part including a first semiconductor layer of a first conductivity type, a second semiconductor layer of a second conductivity type, and a third semiconductor layer of the first conductivity type,
the first semiconductor layer extending between the first and second electrodes, the control electrode being provided between the first semiconductor layer and the second electrode,
the second semiconductor layer being provided between the first semiconductor layer and the second electrode, the second semiconductor layer facing the control electrode via the first insulating film,
the third semiconductor layer being selectively provided between the second semiconductor layer and the second electrode, the third semiconductor layer contacting the first insulating film, the third semiconductor layer being electrically connected to the second electrode,
the control electrode including a first control portion and a second control portion arranged in a direction from the second semiconductor layer of the semiconductor part toward the control electrode,
the third electrode including a first portion and a second portion, the first portion facing the first semiconductor layer of the semiconductor part via the fourth insulating film, the second portion extending between the first control portion and the second control portion,
the second portion of the third electrode being electrically insulated from the control electrode by a fifth insulating film provided between the first control portion and the second control portion,
the first and second control portions each being provided between the second insulating film and the fourth insulating film,
the protrusion of the second insulating film being positioned between the first insulating film and the fifth insulating film and extending toward the fourth insulating film.

11. The device according to claim 10, wherein
the second insulating film has a length along an extension direction of the protrusion, the length of the second insulating film being less than a distance from a tip of the protrusion to a lower end of the control electrode.

12. The device according to claim 10, further comprising:
a third electrode provided inside the trench of the semiconductor part, the third electrode being provided between the control electrode and the first electrode, the third electrode being electrically insulated from the first semiconductor layer of the semiconductor part by a fourth insulating film and electrically insulated from the control electrode by a fifth insulating film,
the protrusion of the second insulating film being positioned between the second insulating film and the fifth insulating film and extending toward the fifth insulating film.

* * * * *